(12) United States Patent
Li et al.

(10) Patent No.: US 11,205,588 B2
(45) Date of Patent: Dec. 21, 2021

(54) INTERCONNECT ARCHITECTURE WITH ENHANCED RELIABILITY

(71) Applicant: International Business Machines Corporation, Armonk, NY (US)

(72) Inventors: Baozhen Li, South Burlington, VT (US); Chih-Chao Yang, Glenmont, NY (US); Naftali E. Lustig, Croton on Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 26 days.

(21) Appl. No.: 16/507,711

(22) Filed: Jul. 10, 2019

(65) Prior Publication Data

US 2021/0013097 A1 Jan. 14, 2021

(51) Int. Cl.
*H01L 21/768* (2006.01)
*H01L 21/311* (2006.01)

(52) U.S. Cl.
CPC ...... *H01L 21/76852* (2013.01); *H01L 21/311* (2013.01); *H01L 21/76829* (2013.01); *H01L 21/76807* (2013.01)

(58) Field of Classification Search
CPC ............. H01L 21/76852; H01L 21/311; H01L 21/76829; H01L 21/76807
See application file for complete search history.

(56) References Cited

U.S. PATENT DOCUMENTS

| 5,521,440 | A | * | 5/1996 | Iranmanesh ........ H01L 23/5226 257/467 |
| 5,614,765 | A | | 3/1997 | Avanzino et al. |
| 6,051,882 | A | | 4/2000 | Avanzino et al. |
| 6,774,489 | B2 | | 8/2004 | Russell et al. |
| 8,299,625 | B2 | | 10/2012 | Ponoth et al. |
| 9,324,650 | B2 | | 4/2016 | Edelstein et al. |
| 9,349,691 | B2 | | 5/2016 | Murray et al. |

(Continued)

OTHER PUBLICATIONS

Briggs, B. D., et al., "Fully Aligned Via Integration for Extendibility of Interconnects to Beyond the 7 nm Node", International Electron Devices Meeting (IEDM), Date of Conference: Dec. 2-6, 2017, 14.2, 4 Pages, Conference Location: San Francisco, CA.

*Primary Examiner* — Marcos D. Pizarro
*Assistant Examiner* — Sue Tang
(74) *Attorney, Agent, or Firm* — Scully, Scott, Murphy & Presser, P.C.; L. Jeffrey Kelly, Esq.

(57) ABSTRACT

Interconnect structures having enhanced reliability is provided in which an electrically conductive structure having a line portion and a via portion is formed utilizing a subtractive process. In some embodiments, a non-conductive barrier liner is formed on physically exposed sidewalls of the via portion and physically exposed sidewalls and a topmost surface of the line portion of the electrically conductive structure. An electrically conductive metal cap is formed on a topmost surface of the via portion of the electrically conductive structure. In other embodiments, a conductive barrier spacer is formed on physically exposed sidewalls of the via portion and physically exposed sidewalls of the line portion of the electrically conductive structure. An electrically conductive metal cap is formed on a topmost surface of the via portion of the electrically conductive structure.

6 Claims, 11 Drawing Sheets

(56) References Cited

U.S. PATENT DOCUMENTS

| | | |
|---|---|---|
| 10,177,031 B2 | 1/2019 | Bao et al. |
| 2007/0077761 A1* | 4/2007 | Lehr ................. H01L 21/76814 |
| | | 438/687 |
| 2009/0212439 A1* | 8/2009 | Farooq .............. H01L 21/76829 |
| | | 257/773 |
| 2015/0056800 A1 | 2/2015 | Mebarki et al. |
| 2016/0197011 A1 | 7/2016 | Bristol et al. |
| 2018/0269305 A1 | 9/2018 | Bao et al. |

* cited by examiner

INTERCONNECT ARCHITECTURE WITH ENHANCED RELIABILITY

BACKGROUND

The present application relates to back-end-of-the-line (BEOL) semiconductor technology. More particularly, the present application relates to BEOL interconnect structures that have enhanced reliability and methods of forming the same.

Generally, semiconductor devices include a plurality of circuits which form an integrated circuit fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene wiring, i.e., interconnect, structures. Within typical dual damascene interconnect structures, electrically conductive metal vias run perpendicular to the semiconductor substrate and electrically conductive metal lines run parallel to the semiconductor substrate.

With aggressive scaling, damascene interconnect structures face major challenges for future technology nodes. Some of these challenges include 1) high electrical resistance due to the inability of liner scaling—relative liner volume becomes large, 2) patterning difficulties, and 3) reliability challenges such as, for example, electromigration (EM) due to the relatively small electrically conductive metal or metal alloy volume in the vias and lines—reduced critical void size to fail, and/or time dependent dielectric breakdown (TDDB) due to difficulties of controlling critical spacing between the vias and lines. There is thus a need for providing interconnect structures having enhanced reliability that can be used for future technology nodes.

SUMMARY

Interconnect structures having enhanced reliability are provided in which an electrically conductive structure having a line portion and a via portion is formed utilizing a subtractive process. In some embodiments, a non-conductive barrier liner is formed on physically exposed sidewalls of the via portion and physically exposed sidewalls and a topmost surface of the line portion of the electrically conductive structure. An electrically conductive metal cap is formed on a topmost surface of the via portion of the electrically conductive structure. In other embodiments, a conductive barrier spacer is formed on physically exposed sidewalls of the via portion and physically exposed sidewalls of the line portion of the electrically conductive structure. An electrically conductive metal cap is formed on a topmost surface of the via portion of the electrically conductive structure.

In one aspect of the present application, an interconnect structure is provided. In one embodiment, the interconnect structure includes at least one electrically conductive structure located on a first dielectric material layer, wherein the at least one electrically conductive structure comprises a via portion located on a line portion. A non-conductive barrier liner is located on physically exposed sidewalls and a topmost surface of the line portion and sidewalls of the via portion of the at least one electrically conductive structure. A second dielectric material layer embeds the at least one electrically conductive structure and the non-conductive barrier liner. An electrically conductive metal cap is located on a topmost surface of the via portion of the at least one electrically conductive structure.

In another embodiment, the interconnect structure includes at least one electrically conductive structure located on a first dielectric material layer, wherein the at least one electrically conductive structure comprises a via portion located on a line portion. A conductive barrier spacer is located on physically exposed sidewalls of the line portion and sidewalls of the via portion of the at least one electrically conductive structure. A second dielectric material layer embeds the at least one electrically conductive structure and the conductive barrier spacer. An electrically conductive metal cap is located on a topmost surface of the via portion of the at least one electrically conductive structure.

In another aspect of the present application, a method of forming an interconnect structure is provided. In one embodiment, the method includes forming, by a subtractive process, at least one electrically conductive structure having a line portion and a via portion on a surface of a first dielectric material layer. The at least one electrically conductive structure is then embedded in a second dielectric material layer, and thereafter an electrically conductive metal cap is formed on a topmost surface of the via portion of the electrically conductive structure.

BRIEF DESCRIPTION OF THE DRAWINGS

FIG. 5B is a cross sectional view of the exemplary structure of FIG. 5A through line X-X'.

FIG. 6B is a cross sectional view of the exemplary structure of FIG. 6A through line X-X'.

DETAILED DESCRIPTION

Figure 1A:
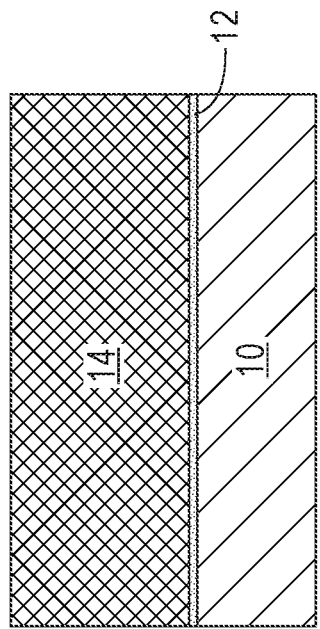
FIG. 1A is a top down view of an exemplary structure of a first dielectric material layer, a first non-conductive barrier material layer, and an electrically conductive metal-containing material layer that can be employed in accordance with a first embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring to FIGS. 1A-7B, there are shown basic processing steps in accordance with a first embodiment of the present application. The first embodiment of the present application provides an interconnect structure that has enhanced reliability. Notably, and in the first embodiment, an electrically conductive metal cap, which is highly conductive, and not permeable for a via and line metal, is formed on a topmost surface of a via portion of an electrically conductive structure. The presence of the electrically conductive metal cap on the topmost surface of the via portion of the electrical conductive ensures short length EM benefits to the resultant interconnect structure. The first embodiment of the present application will now be described in greater detail.

Figure 1B:
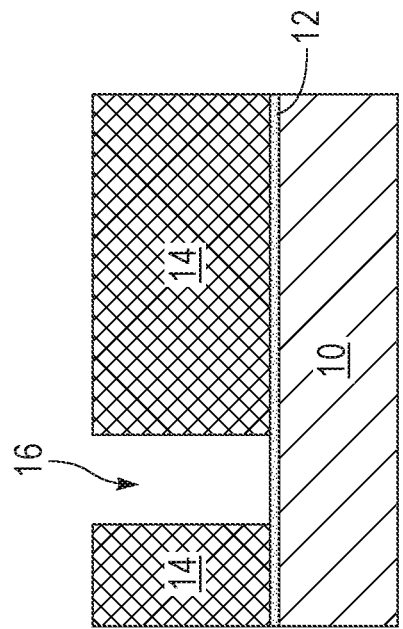
FIG. 1B is a cross sectional view of the exemplary structure of FIG. 1A through line X-X'.

Referring first to FIGS. 1A-1B, there are shown various views of an exemplary structure that can be employed in accordance with the first embodiment of the present application. The exemplary structure of FIGS. 1A-1B includes a material stack of, from bottom to top, a first dielectric material layer 10, a first non-conductive barrier material layer 12, and an electrically conductive metal-containing material layer 14.

Although not shown in FIGS. 1A-1B, the first dielectric material layer 10 can contain an electrically conductive structure embedded therein; in such an embodiment the electrically conductive structure that is embedded in the first dielectric material layer can be formed utilizing a subtractive process as described herein or a damascene process. Although not shown, the material stack of FIGS. 1A and 1B is typically formed above a front-end-of-the-line structure that includes a semiconductor substrate that contains a plurality of semiconductor devices formed therein or thereupon.

The first dielectric material layer 10 can be composed of an inorganic dielectric material or an organic dielectric material. In some embodiments, the first dielectric material layer 10 may be porous. In other embodiments, the first dielectric material layer 10 may be non-porous. Examples of suitable dielectric materials that can be employed as the first dielectric material layer 10 include, but are not limited to, silicon dioxide, undoped or doped silicate glass, silsesquioxanes, C doped oxides (i.e., organosilicates) that include atoms of Si, C, O and H, theremosetting polyarylene ethers or any multilayered combination thereof. The term "polyarylene" is used in this present application to denote aryl moieties or inertly substituted aryl moieties which are linked together by bonds, fused rings, or inert linking groups such as, for example, oxygen, sulfur, sulfone, sulfoxide, or carbonyl.

The first dielectric material layer 10 may have a dielectric constant (all dielectric constants mentioned herein are measured relative to a vacuum, unless otherwise stated) that is about 4.0 or less. In one embodiment, the first dielectric material layer 10 has a dielectric constant of 2.8 or less. These dielectrics generally having a lower parasitic cross talk as compared to dielectric materials whose dielectric constant is greater than 4.0.

The first dielectric material layer 10 can be formed by a deposition process such as, for example, chemical vapor deposition (CVD), plasma enhanced chemical vapor deposition (PECVD) or spin-on coating. The first dielectric material layer 10 may have a thickness from 50 nm to 250 nm. Other thicknesses that are lesser than 50 nm, and greater than 250 nm can also be employed in the present application.

The first non-conductive barrier material layer 12 that can be employed in the present application includes an electrically insulating material that can enhance metal/dielectric material adhesion and reduce metal interface diffusion. Examples of barrier materials that can be used as the first non-conductive barrier material layer include, for example, aluminum nitride, aluminum oxynitride, or a material that includes atoms of at least Si, C and N (i.e., a SiCN material). In some embodiments, the first non-conductive barrier material layer 12 can be omitted from the exemplary structure.

The first non-conductive barrier material layer 12 can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating. The thickness of the first non-conductive barrier material layer 12 may vary depending on the deposition process used as well as the material employed. In some embodiments, the first non-conductive barrier material layer 12 may have a thickness from 2 nm to 50 nm; although other thicknesses for the first non-conductive barrier material layer 12 are contemplated and can be employed in the present application.

The electrically conductive metal-containing material layer 14 that can be employed in the present application can include an electrically conductive metal or metal alloy. The electrically conductive metal or metal alloy that can provide the electrically conductive metal-containing material layer 14 can be composed of copper (Cu), aluminum (Al), tungsten (W), or an alloy thereof such as, for example, a Cu—Al alloy. The electrically conductive metal-containing material layer 14 can be formed utilizing a deposition process such as, for example, chemical vapor deposition (CVD), plasma enhanced chemical vapor deposition (PECVD), sputtering, chemical solution deposition or plating. In one embodiment, a bottom-up plating process is employed in forming the electrically conductive metal-containing material layer 14. The thickness of the electrically conductive metal-containing material layer 14 may vary depending on the deposition process used as well as the material employed. In some embodiments, the electrically conductive metal-containing material layer 14 can have a thickness from 50 nm to 1000 nm; although other thicknesses for the electrically conductive metal-containing material layer 14 are contemplated and can be employed in the present application as long as the thickness is sufficient for forming an electrically conductive structure that includes a line portion and a via portion.

Figure 2A:
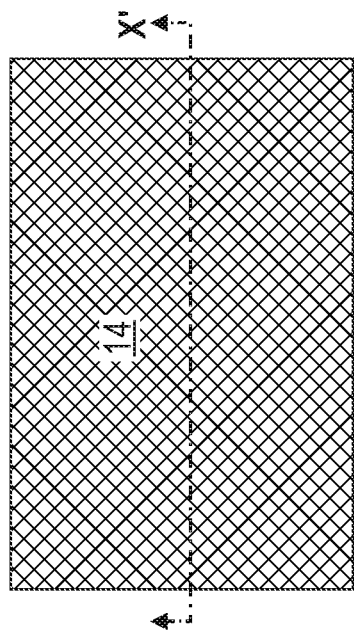
FIG. 2A is a top down view of the exemplary structure of FIG. 1A after performing a line patterning process on the electrically conductive metal-containing material layer.
Figure 2B:
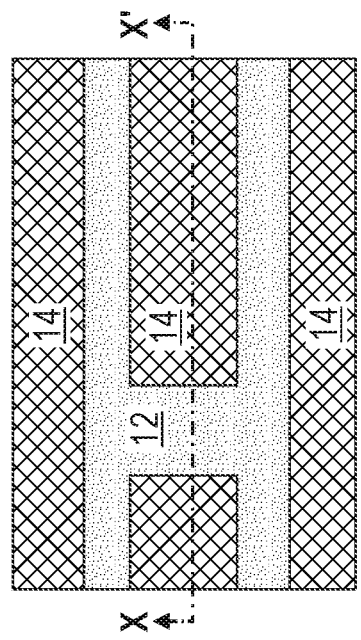
FIG. 2B is a cross sectional view of the exemplary structure of FIG. 2A through line X-X'.

Referring now to FIGS. 2A-2B, there are shown through various views the exemplary structure of FIGS. 1A-1B after performing a line patterning process on the electrically conductive metal-containing material layer 14. The line patterning process defines the width and length of a line portion of an individual electrically conductive structure to be subsequently formed. In one example, the line patterning process defines a line portion of an individual electrically conductive structure to be subsequently formed that has a width from 10 nm to 1000 nm, and a length from 20 nm to 100,000 nm. Other widths and lengths for the line portion of an individual electrically conductive structure are possible and are thus not excluded from being used in the present application.

The line patterning process can include lithography and etching. Lithography includes forming a photoresist material over a material or material stack to be patterned, exposing the photoresist material to a pattern of irradiation, and developing the exposed photoresist material. The etching can include an anisotropic etch etching process such as, for example, reactive ion etching.

In this embodiment of the present application, the line patterning process forms openings 16 into the electrically conductive metal-containing material layer 14 that physically expose a topmost surface of the underlying first non-conductive barrier material layer 12. When the first non-conductive barrier material layer 12 is omitted, the openings 16 can physically expose a topmost surface of the first dielectric material layer 10. In one example, the openings 16 that are formed into the electrically conductive metal-containing material layer 14 have a width from 10 nm to 1000 nm.

Figure 3A:
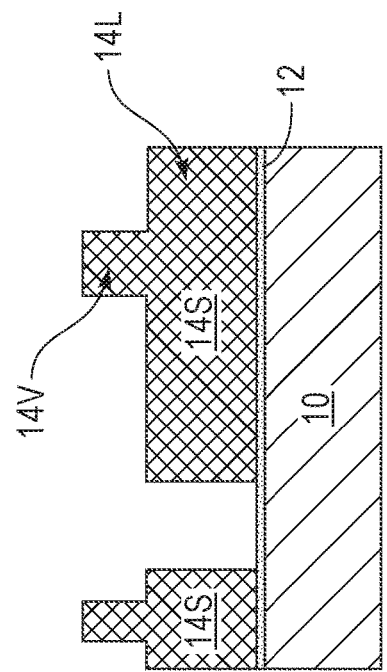
FIG. 3A is a top down view of the exemplary structure of FIG. 2A after performing a via patterning process on the remaining electrically conductive metal-containing material layer, wherein the line patterning process and the via patterning process collectively provide at least one electrically conductive structure containing a line portion and a via portion.
Figure 3B:
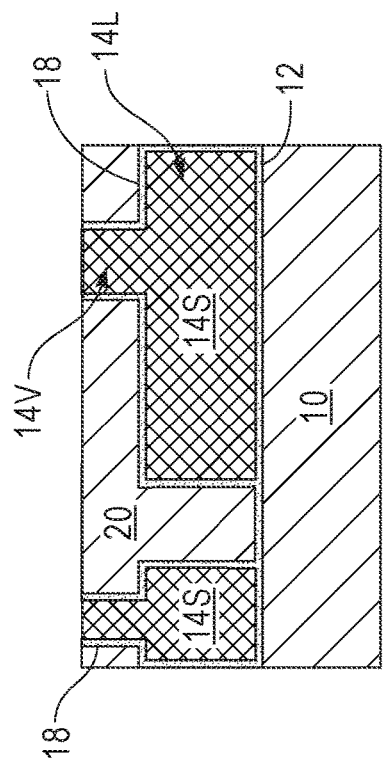
FIG. 3B is a cross sectional view of the exemplary structure of FIG. 3A through line X-X'.

Referring now to FIGS. 3A-3B, there are shown through various views the exemplary structure of FIGS. 2A-2B, after performing a via patterning process on the remaining electrically conductive metal-containing material layer 14. In accordance with the present application, the line patterning process, defined above, and the via patterning process collectively provide at least one electrically conductive structure 14S containing a line portion 14L (defined by the line patterning process defined above) and a via portion 14V (defined by the via patterning process). Each electrically conductive structure 14S that is formed in the present application can be referred to as a subtractive electrically conductive structure 14S since each electrically conductive structure 14S is formed by a subtractive process which includes deposition of an electrically conductive metal or metal alloy, following by the line and via patterning processes mentioned above which remove some of the originally deposited electrically conductive metal or metal alloy that provides the electrically conductive metal-containing material layer 14.

The via patterning process defines the width and length of a via portion 14V of an individual electrically conductive structure 14S; the width and length of the via portion 14V are less than or equal to the width and length of the line portion 14L. In one example, the via patterning process defines a via portion 14V of an individual electrically conductive structure 14S that has a width from 8 nm to 40 nm, and a length from 8 nm to 100 nm. Other widths and lengths for the via portion 14V of an individual electrically conductive structure 14S are possible and are thus not excluded from being used in the present application. The via patterning process can include lithography and etching, as defined above.

In the present application, the via portion 14V is located directly above a line portion 14L of an individual electrically conductive structure 14S. The line portion 14L thus serves as a base of the electrically conductive structure 14S while the via portion 14V provides topography to the electrically conductive structure 14S. Each electrically conductive structure 14S that is formed is of unitary construction and is composed of a same electrically conductive metal or metal alloy as that which provides the electrically conductive metal-containing material layer 14.

Figure 4A:
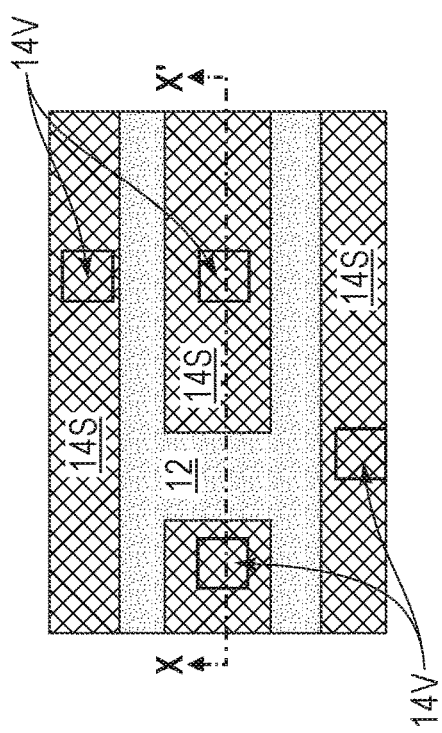
FIG. 4A is a top down view of the exemplary structure of FIG. 3A after forming a non-conductive barrier liner on the at least one electrically conductive structure, and a second dielectric material layer.
Figure 4B:
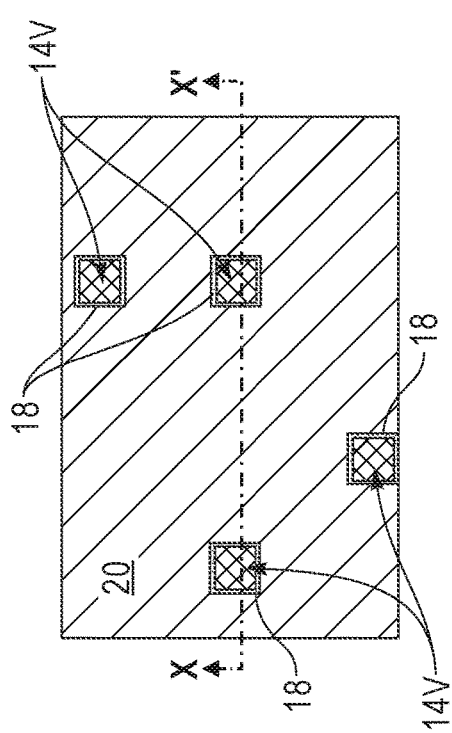
FIG. 4B is a cross sectional view of the exemplary structure of FIG. 4A through line X-X'.

Referring now to FIGS. 4A-4B, there are shown through various views the exemplary structure FIGS. 3A-3B after forming a non-conductive barrier liner 18 on the at least one electrically conductive structure 14S, and a second dielectric material layer 20. As is shown in FIGS. 4A-4B, the non-conductive barrier liner 18 is present on physically exposed sidewalls and topmost surfaces of the line portion 14L of the electrically conductive structure 14S, and on physically exposed sidewalls of the via portion 14V of the electrically conductive structure. As is further shown in FIGS. 4AS-4B, the second dielectric material layer 20 fills in the gaps between each electrically conductive structure 14S and thus embeds each electrically conductive structure 14S that is formed. Collectively, the second dielectric material layer 20, and the barrier material lined electrically conductive structures define an interconnect level of an interconnect structure.

The non-conductive barrier liner 18 includes one of the electrically insulating materials that can enhance metal/dielectric material adhesion and reduce metal interface diffusion as mentioned above for the first non-conductive barrier material layer 12. In one embodiment, the non-conductive barrier liner 18 is composed of a compositionally same electrically insulating material as the first non-conductive barrier material layer 12. In another embodiment, the non-conductive barrier liner 18 is composed of a compositionally different electrically insulating material than the first non-conductive barrier material layer 12. The non-conductive barrier liner 18 can be formed utilizing a deposition process such as, for example, chemical vapor deposition (CVD), plasma enhanced chemical vapor deposition (PECVD), atomic layer deposition (ALD), or physical vapor deposition (PVD). In some embodiments, a conformal deposition process is employed. The conformal deposition process provides a conformal material layer that has a same thickness as measured along a vertical surface as compared to a horizontal surface. In other embodiments, a non-conformal deposition process is used. In either case, the first non-conductive barrier liner 18 typically has a thickness from 1 nm to 20 nm; other thicknesses for the first non-conductive barrier liner 18 are contemplated and can be employed in the present application as long as the selected thickness does not entirely fill in the gaps between each electrically conductive structure 14S that is provided by the line and via patterning processes.

The second dielectric material layer 20 includes one of the dielectric materials mentioned above for the first dielectric material layer 10. In one embodiment, the second dielectric material layer 20 is composed of a compositionally same dielectric material as the first dielectric material layer 10. In another embodiment, the second dielectric material layer 20 is composed of a compositionally different dielectric material than the first dielectric material layer 10. The second dielectric material can be formed utilizing one of the deposition processes mentioned above in forming the first dielectric material layer. A planarization process such as, for example, chemical mechanical polishing (CMP) and/or grinding, follows the deposition of the dielectric material that provides the second dielectric material layer 20. The planarization process removes barrier material and dielectric material from the topmost surface of each via portion 14V of the electrically conductive structures 14S. A planar structure is provided in which the second dielectric material layer 20 has a topmost surface that is coplanar with topmost surfaces of the first non-conductive barrier liner 18 as well as the topmost surface of each via portion 14V.

Figure 5A:
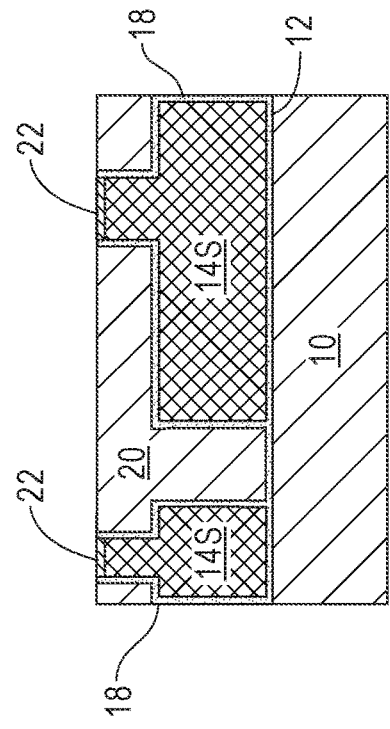
FIG. 5A is a top down view of the exemplary structure of FIG. 4A after forming an electrically conductive metal cap on a topmost surface of the via portion of the at least one electrically conductive structure.
Figure 5A:
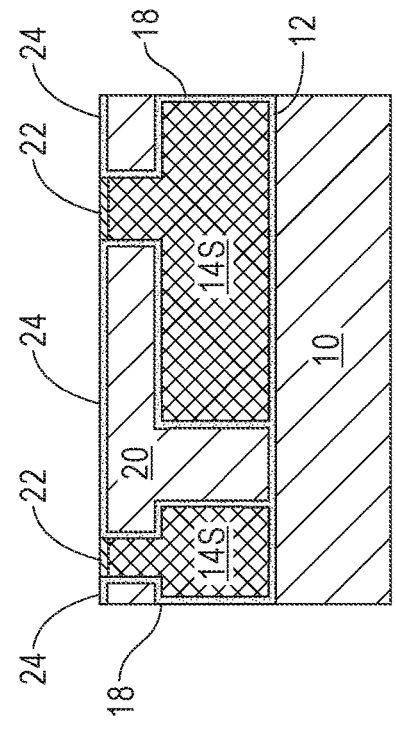
Figure 5A:
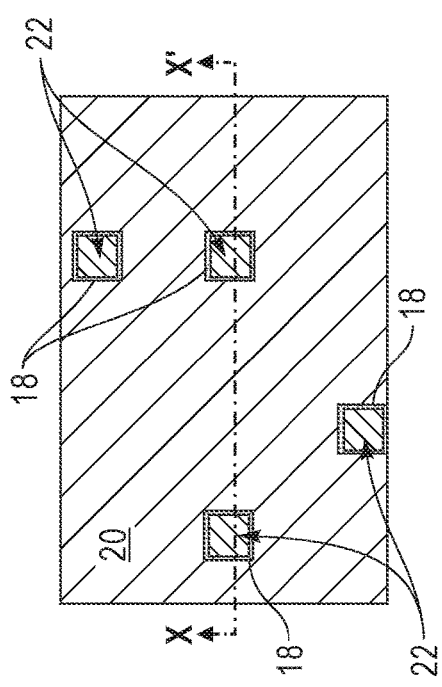

Referring now to FIGS. 5A-5B, there are shown through various views the exemplary structure FIGS. 4A-4B after forming an electrically conductive metal cap 22 on a topmost surface of the via portion 14L of the at least one electrically conductive structure 14S. The electrically conductive metal cap 22 is formed utilizing a selective deposition process which forms the electrically conductive metal cap 22 only on the topmost surface of each via portion 14V. In one example, the selective deposition can include chemical vapor deposition (CVD), physical vapor deposition (PVD) or a wet selective deposition process.

The electrically conductive metal cap 22 is composed of a metal diffusion barrier material such as, for example, Co, Ta, TaN, W, or Ru, which can provide short length EM benefit to the exemplary structure. The electrically conductive metal cap 22 can have a thickness from 1 nm to 5 nm; although other thicknesses for the electrically conductive metal cap 22 are contemplated and can be employed in the present application as long as the thickness is sufficient for providing short length EM benefit to the exemplary structure. By "short length EM benefit" it is meant that when electrically conductive structures of various interconnect levels are physically divided into short segments by the non-permeable electrically conductive metal cap 22, the interconnect structure become more EM resistive.

Figure 6A:
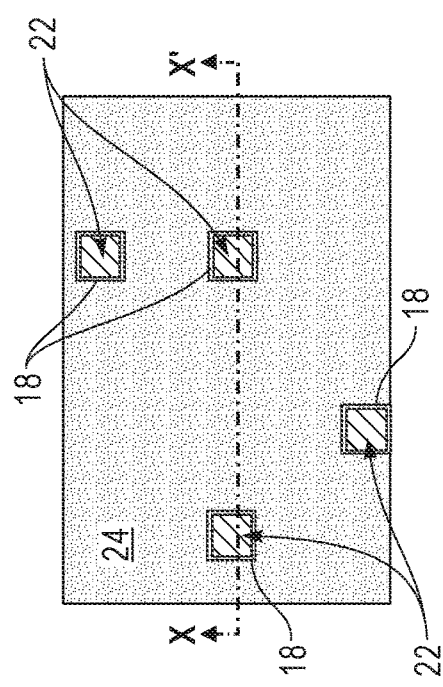
FIG. 6A is a top down view of the exemplary structure of FIG. 5A after forming a second non-conductive barrier material layer on physically exposed surfaces of the second dielectric material layer.

Referring now to FIGS. 6A-6B, there are shown through various views the exemplary structure FIGS. 5A-5B after forming a second non-conductive barrier material layer 24 on physically exposed surfaces of the second dielectric material layer 20. The second non-conductive barrier material layer 24 includes one of the electrically insulating materials that can enhance metal/dielectric material adhesion and reduce metal interface diffusion as mentioned above for the first non-conductive barrier material layer 12. In one embodiment, the second non-conductive barrier material layer 24 is composed of a compositionally same electrically insulating material as the first non-conductive barrier material layer 12 and/or the non-conductive barrier liner 18. In another embodiment, the second non-conductive barrier material layer 24 is composed of a compositionally different electrically insulating material than the first non-conductive barrier material layer 12 and/or the non-conductive barrier liner 18.

The second non-conductive barrier material layer 24 can be formed utilizing one of the deposition processes mentioned above for forming the first non-conductive barrier material layer 12, followed by a patterning process such as, for example, lithography and etching, so as to physically expose the electrically conductive metal cap 22 that is formed on the topmost surface of the via portion 14V of each electrically conductive structure. The second non-conductive barrier material layer 24 can have a thickness from 2 nm to 40 nm. The second non-conductive barrier material layer 24 can have a topmost surface that is coplanar with, or non-coplanar with, a topmost surface of the electrically conductive metal cap 22.

Figure 7B:
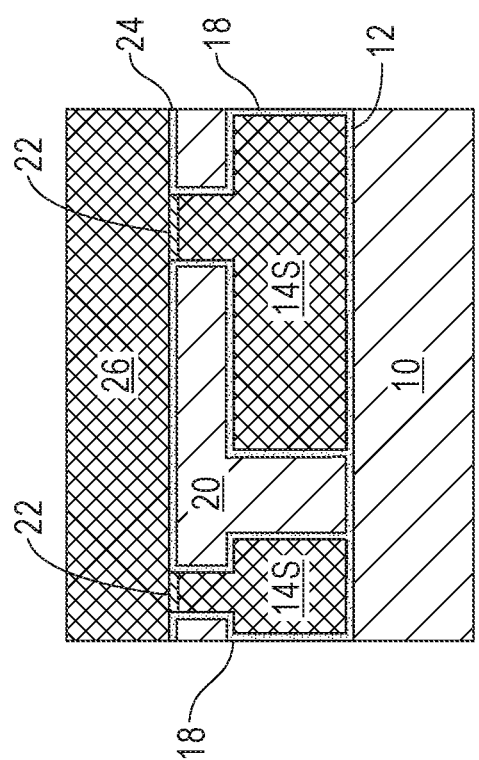
FIG. 7B is a cross sectional view of the exemplary structure of FIG. 7A through line X-X'.
Figure 7A:
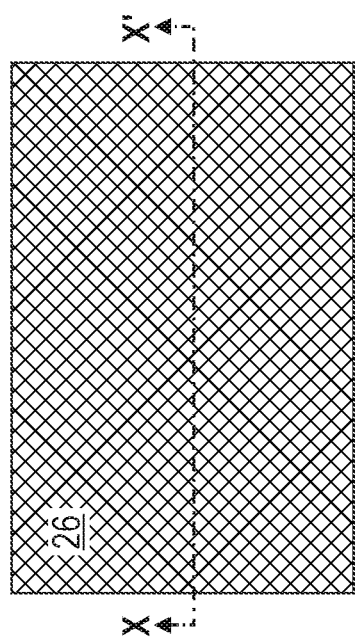
FIG. 7A is a top down view of the exemplary structure of FIG. 6A after forming another electrically conductive metal-containing material layer.

Referring now to FIGS. 7A-7B, there are shown through various views the exemplary structure FIGS. 6A-6B after forming another electrically conductive metal-containing material layer 26. The another conductive metal-containing material layer 26 includes one of the electrically conductive metals or metal alloys mentioned above for the electrically conductive metal-containing material layer 14. In one embodiment, the another electrically conductive metal-containing material layer 26 is composed of a compositionally same electrically conductive metal or metal alloy as the electrically conductive metal-containing material layer 14. In another embodiment, the another electrically conductive metal-containing material layer 26 is composed of a compositionally different electrically conductive metal or metal alloy than the electrically conductive metal-containing material layer 14. The another electrically conductive metal-containing material layer 26 can be formed utilizing one of the deposition processes mentioned above for forming the electrically conductive metal-containing material layer 10. Processing as shown in FIGS. 2A-6B can be performed on the another electrically conductive metal-containing material layer 26 to provide a next interconnect level having enhanced reliability.

Referring to FIGS. 8A-13B, there are shown basic processing steps in accordance with a second embodiment of the present application. The second embodiment of the present application provides an interconnect structure that has enhanced reliability. Notably, and in the second embodiment, the first barrier material layer 12 located between the first dielectric material layer 10 and the electrically conductive metal-containing layer 14 has been omitted to reduce capacitance. Also, and in the second embodiment, a shallow cut is formed into the first dielectric material layer 10 to enlarge the process window for shorting and to enhance TDDB. Further, and in the second embodiment, an electrically conductive metal cap 22, which is highly conductive, is formed on a topmost surface of a via portion 14V of an electrically conductive structure 14S. As mentioned above, the presence of the electrically conductive metal cap on the topmost surface of the via portion of the electrical conductive ensures short length EM benefits to the resultant interconnect structure. The second embodiment of the present application will now be described in greater detail.

Figure 8B:
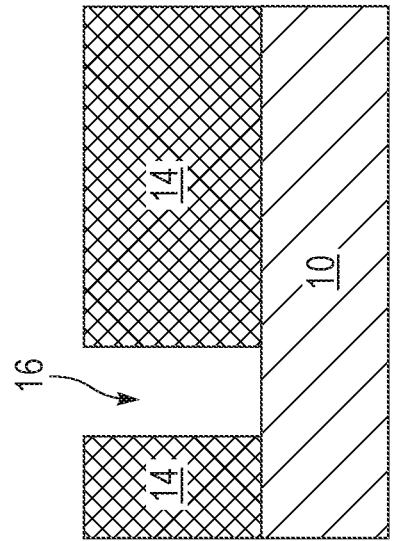
FIG. 8B is a cross sectional view of the exemplary structure of FIG. 8A through line X-X'.
Figure 8A:
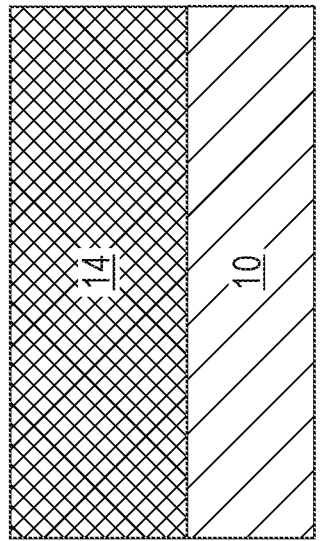
FIG. 8A is a top down view of an exemplary structure of a first dielectric material layer, and an electrically conductive metal-containing material layer that can be employed in accordance with a second embodiment of the present application.

Referring first to FIGS. 8A-8B, there are shown various views of an exemplary structure that can be employed in accordance with the second embodiment of the present application. The exemplary structure of FIGS. 8A-8B includes a material stack of, from bottom to top, a first dielectric material layer 10 and an electrically conductive metal-containing material layer 14. In this embodiment, the electrically conductive metal-containing material layer 14 forms a material interface with the first dielectric material layer 10.

The first dielectric material layer 10 and the electrically conductive metal-containing material layer 14 that are employed in the second embodiment are identical to the first dielectric material layer 10 and the electrically conductive metal-containing material layer 14 that are employed in the first embodiment of the present application. Thus, the various materials, deposition process and thicknesses mentioned above for the first dielectric material layer 10 and the electrically conductive metal-containing material layer 14 are applicable here for the second embodiment of the present application.

Figure 9B:
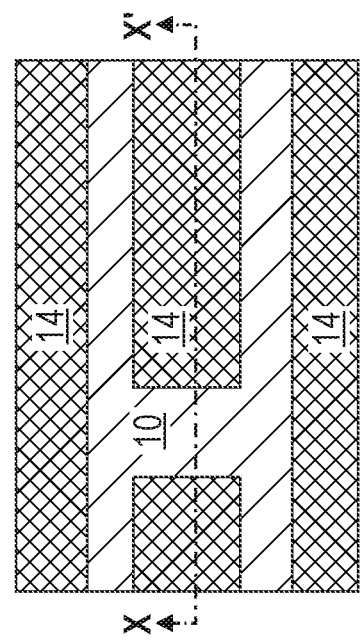
FIG. 9B is a cross sectional view of the exemplary structure of FIG. 9A through line X-X'.
Figure 9A:
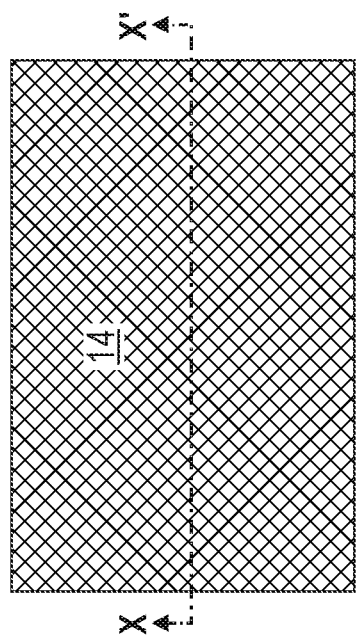
FIG. 9A is a top down view of the exemplary structure of FIG. 8A after performing a line patterning process on the electrically conductive metal-containing material layer.

Referring now to FIGS. 9A-9B, there are shown through various views the exemplary structure of FIGS. 8A-8B after performing a line patterning process, as defined above, on the electrically conductive metal-containing material layer 14. As in the first embodiment, the line patterning process defines the width and length of a line portion of an individual electrically conductive structure to be subsequently formed.

In this embodiment of the present application, the line patterning process forms openings 16 into the electrically conductive metal-containing material layer 14 that physically expose a topmost surface of the underlying first dielectric material layer 10. In one example, the openings 16 that are formed into the electrically conductive metal-containing material layer 14 have a width from 10 nm to 60 nm.

Figure 10B:
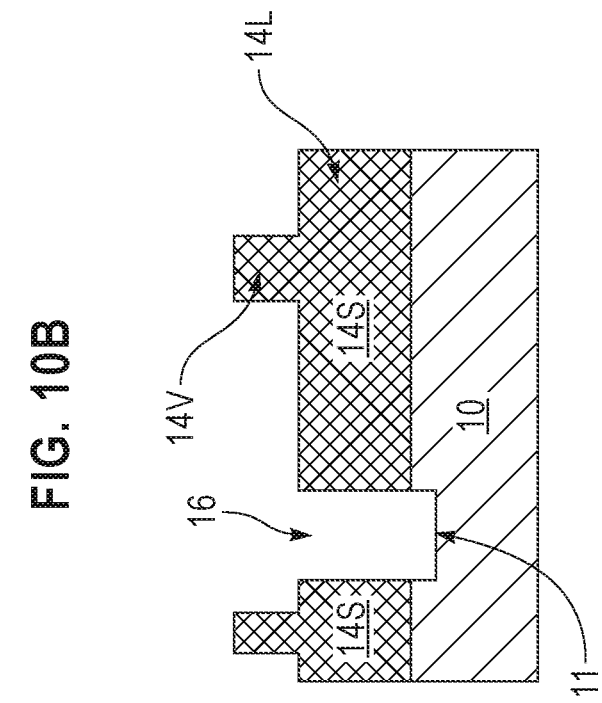
FIG. 10B is a cross sectional view of the exemplary structure of FIG. 10A through line X-X'.
Figure 10A:
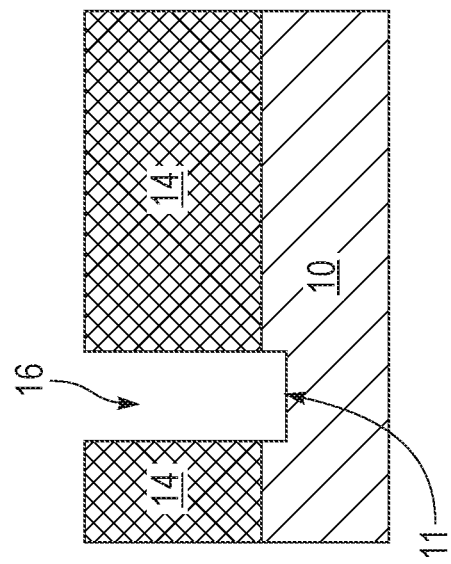
FIG. 10A is a top down view of the exemplary structure of FIG. 9A after recessing physically exposed portions of the first dielectric material layer.

Referring now to FIGS. 10A-10B, there are shown through various views the exemplary structure of FIGS. 9A-9B after recessing physically exposed portions of the first dielectric material layer 10. The recessing step physically exposes a sub-surface 11 of the first dielectric material layer 10. By 'sub-surface" it is meant a surface of a material that is located between a topmost surface and the bottommost surface of a material. In one embodiment, the exposed sub-surface 11 of the first dielectric material layer 10 that is physically exposed by the recessing process is from 2 nm to 10 nm beneath the topmost surface of the first dielectric material layer 10. As mentioned above, the recessing provides a shallow cut into the first dielectric material layer 10 that enlarges the process window for shorting and enhanced TDDB. The recessing occurs through openings 16 and is performed utilizing an etching process that is selective for removing dielectric material as compared to the electrically conductive metal or metal alloy that provides the first dielectric material.

Figure 11B:
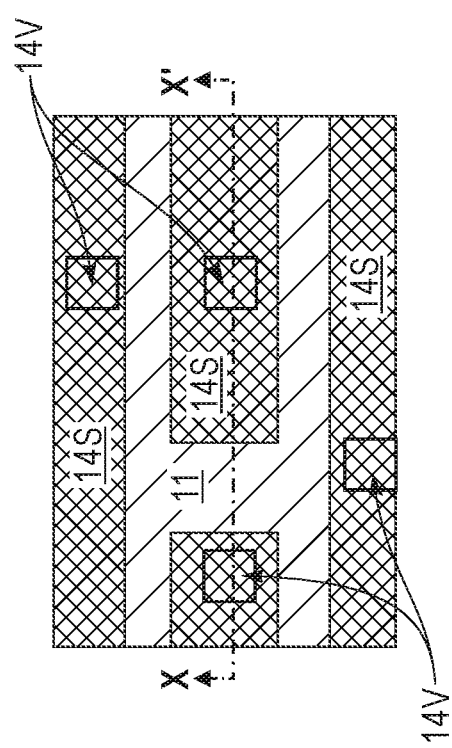
FIG. 11B is a cross sectional view of the exemplary structure of FIG. 11A through line X-X'.
Figure 11A:
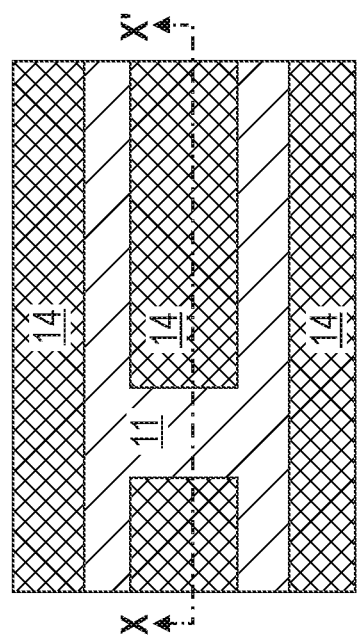
FIG. 11A is a top down view of the exemplary structure of FIG. 10A after performing a via patterning process on the remaining electrically conductive metal-containing material layer, wherein the line patterning process and the via patterning process collectively provide at least one electrically conductive structure containing a line portion and a via portion.

Referring now to FIGS. 11A-11B, there are shown through various views the exemplary structure of FIGS. 10A-10B after performing a via patterning process, as defined above, on the remaining electrically conductive metal-containing material layer 14, wherein the line patterning process and the via patterning process provide at least one electrically conductive structure 14S containing a line portion 14L and a via portion 14V.

Figure 12A:
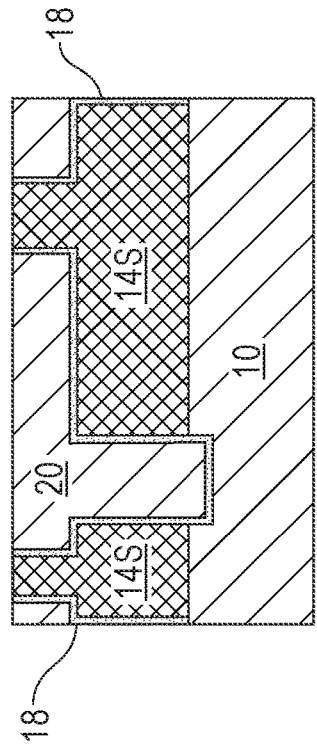
FIG. 12A is a top down view of the exemplary structure of FIG. 11A after forming a non-conductive barrier liner on the at least one electrically conductive structure, and a second dielectric material layer.
Figure 12B:
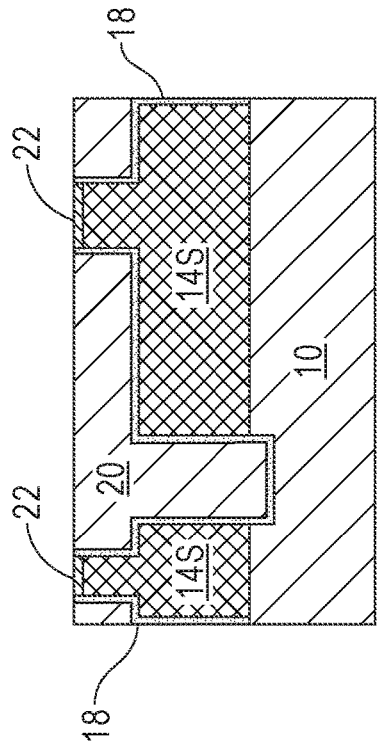
FIG. 12B is a cross sectional view of the exemplary structure of FIG. 12A through line X-X'.

Referring now to FIGS. 12A-12B, there are shown through various views the exemplary structure of FIGS. 11A-11B after forming a non-conductive barrier liner 18 on the at least one electrically conductive structure 14S, and a second dielectric material layer 20. As is shown in FIGS. 12A-12B, the non-conductive barrier liner 18 is present on the physically exposed sub-surface 11 of the first dielectric material layer 10, the physically exposed sidewalls and topmost surfaces of the line portion 14L of the electrically conductive structure 14S, and on physically exposed sidewalls of the via portion 14V of the electrically conductive structure. As is further shown in FIGS. 12A-12B, the second dielectric material layer 20 fills in the gaps between each electrically conductive structure 14S and thus embeds each electrically conductive structure 14S that is formed. Collectively, the second dielectric material layer 20, the barrier material lined electrically conductive structures define an interconnect level of an interconnect structure.

The non-conductive barrier liner 18 and the second dielectric material layer 20 that are employed in the second embodiment are identical to the non-conductive barrier liner 18 and the second dielectric material layer 20 employed in the first embodiment. Thus, the various materials, deposition process and thicknesses mentioned above for the non-conductive barrier liner 18 and the second dielectric material layer 20 are applicable here for the second embodiment of the present application. As is shown, the second dielectric material layer 20 has a topmost surface that is coplanar with topmost surfaces of the non-conductive barrier liner 18 and the topmost surface of the via portion 14V of each electrically conductive structure. In this embodiment, a portion of the non-conductive barrier liner 18 is located on sub-surface 11 of the first dielectric material layer 10.

Figure 13A:
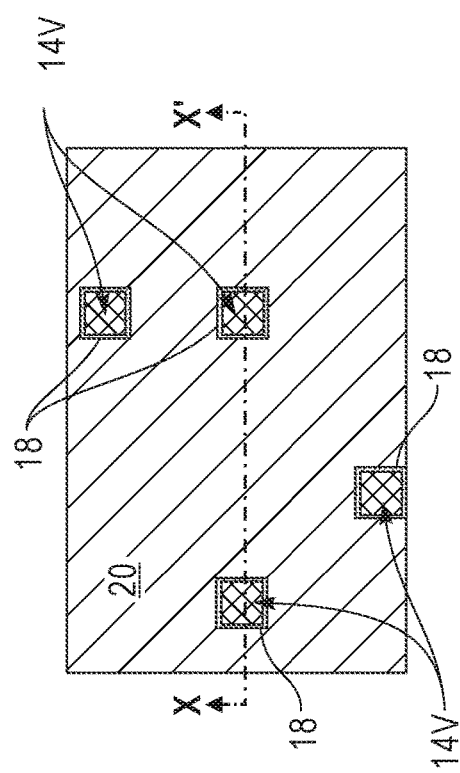
FIG. 13A is a top down view of the exemplary structure of FIG. 12A after forming an electrically conductive metal cap on a topmost surface of the via portion of the at least one electrically conductive structure.
Figure 13B:
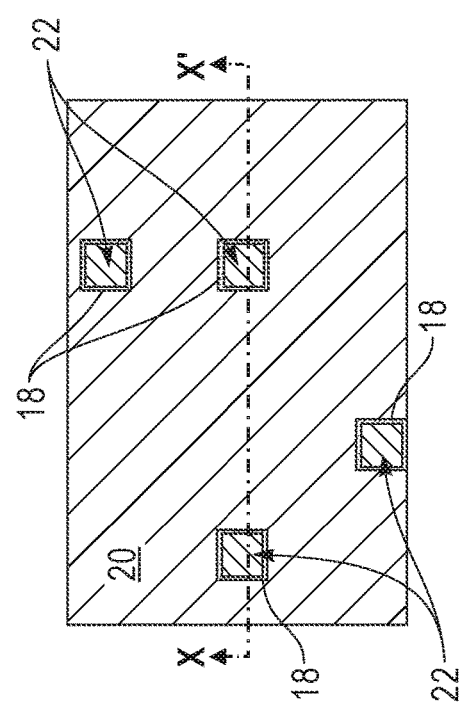
FIG. 13B is a cross sectional view of the exemplary structure of FIG. 13A through line X-X'.

Referring now to FIGS. 13A-13B, there are shown through various views the exemplary structure of FIGS. 12A-12B after forming an electrically conductive metal cap 22 on a topmost surface of the via portion 14V of the at least one electrically conductive structure 14S. The electrically conductive metal cap 22 that is employed in the second embodiment is identical to the electrically conductive metal cap 22 employed in the first embodiment. Thus, the various materials, deposition process and thicknesses mentioned above for electrically conductive metal cap 22 are applicable here for the second embodiment of the present application.

Although not shown in the present application, another electrically conductive metal-containing layer can be formed atop the exemplary structure shown in FIGS. 13A-13B and processed as in the second embodiment to provide another interconnect level of an interconnect structure.

Referring to FIGS. 14-18, there are shown basic processing steps in accordance with a third embodiment of the present application; the third embodiment highlights the via area when misalignment occurs. The third embodiment of the present application provides an interconnect structure that has enhanced reliability similar to that described above for the second embodiment. Notably, and in the third embodiment, the first barrier material layer 12 located between the first dielectric material layer 10 and the electrically conductive metal-containing layer 14 has been omitted to reduce capacitance. Also, and in the third embodiment, a shallow cut is formed into the first dielectric material layer 10 to enlarge the process window for shorting and to enhance TDDB. Further, and in the third embodiment, an electrically conductive metal cap 22, which is highly conductive, is formed on a topmost surface of a via portion 14V of an electrically conductive structure 14S. As mentioned above, the presence of the electrically conductive metal cap on the topmost surface of the via portion of the electrical conductive ensures short length EM benefits to the resultant interconnect structure. The third embodiment of the present application will now be described in greater detail.

Figure 14:
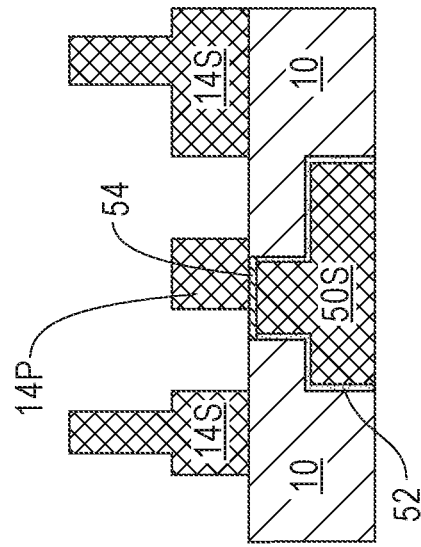
FIG. 14 is a cross sectional view of an exemplary structure including an interconnect level containing a first dielectric material layer having at least one first electrically conductive structure embedded therein, and an electrically conductive metal-containing material layer located above the interconnect level that can be employed in accordance with a third embodiment of the present application.

Referring now to FIG. 14, there is illustrated an exemplary structure including an interconnect level containing a first dielectric material layer 10 having at least one first electrically conductive structure 50S embedded therein, and an electrically conductive metal-containing material layer 14 located above the interconnect level that can be employed in accordance with a third embodiment of the present application. The first electrically conductive structure 50S that is embedded in the first dielectric material layer 10 has a line portion and a via portion and contains a non-conductive barrier liner 52 and an electrically conductive metal cap 54.

The first electrically conductive structure 50S can be formed by first providing a layer of an electrically conductive metal or metal alloy, as defined above for electrically conductive metal-containing material layer 14, and then performing line patterning and via patterning as defined above in FIGS. 2A-3B to provide the first electrically conductive structure 50S. The non-conductive barrier liner 52 is then formed. The non-conductive barrier liner 52 is the same as the non-conductive barrier liner 18 mentioned in the previous embodiments of the present application. Next, first dielectric material layer 10 is formed, followed by the formation of electrically conductive metal cap 54. Electrically conductive metal cap 54 is the same as electrically conductive metal cap 22 mentioned above.

Electrically conductive metal-containing material layer 14, as defined above, is then formed upon the interconnect level including the first dielectric material layer 10 and the first electrically conductive structure 50S.

Figure 15:
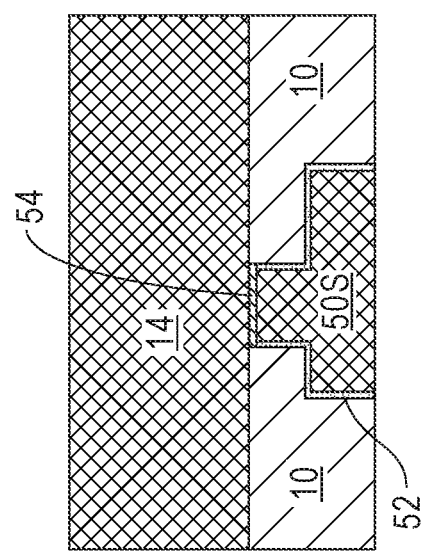
FIG. 15 is a cross sectional view of the exemplary structure of FIG. 14 after patterning the electrically conductive metal-containing material layer to provide at least one second electrically conductive structure having a line portion and a via portion, and at least one electrically conductive metal-containing material portion on the interconnect level, wherein the at least one electrically conductive metal-containing material portion is located above, and misaligned to, the at least one first electrically conductive structure.

Referring now to FIG. 15, there is illustrated the exemplary structure of FIG. 14 after patterning the electrically conductive metal-containing material layer to provide at least one second electrically conductive structure 14S having a line portion 14L and a via portion 14V, and at least one electrically conductive metal-containing material portion 14P on the interconnect level, wherein the at least one electrically conductive metal-containing material portion 14P is located above, and misaligned to, the at least one first electrically conductive structure 50S. The exemplary structure shown in FIG. 15 can be formed by performing separate line patterning and via patterning process as defined above for the first embodiment of the present application.

Figure 16:
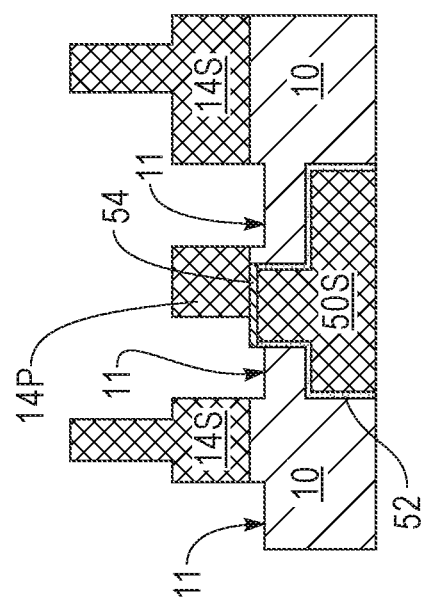
FIG. 16 is a cross sectional view of the exemplary structure of FIG. 15 after recessing physically exposed portions of the first dielectric material layer.

Referring now to FIG. 16, there is illustrated the exemplary structure of FIG. 15 after recessing physically exposed portions of the first dielectric material layer 10. The recessing physically exposes a sub-surface 11 of the first dielectric material layer 10. The recessing is performed utilizing the same technique as mentioned above in providing the exemplary structure shown in 10A-10B.

Figure 17:
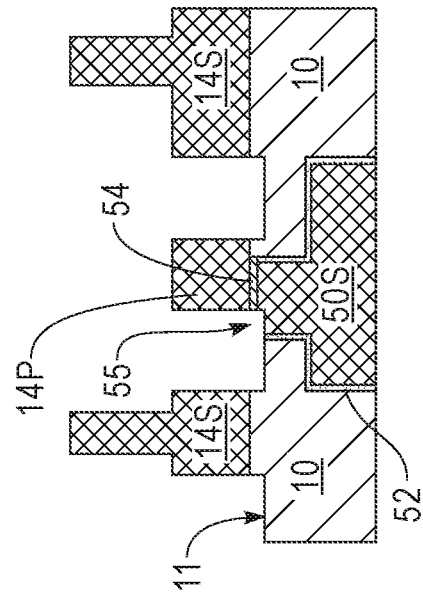
FIG. 17 is a cross sectional view of the exemplary structure of FIG. 16 after performing a metal reactive ion etch process to trim the physically exposed portion of the at least one first electrically conductive structure.

Referring now to FIG. 17, there is illustrated the exemplary structure of FIG. 16 after performing a metal reactive ion etch process to trim the physically exposed portion of the at least one first electrically conductive structure 50S. This step removes the physically exposed portion of the electrically conductive metal cap 54, uppermost vertical portions of the non-conductive barrier liner 52, and a region of the via portion of the at least one first electrically conductive structure 50S. The metal reactive ion etch process removes the mis-aligned via portion of the at least one first electrically conductive structure 50S. The trimming step provides a step region 55 into an upper portion of one side of the via portion of the first electrically conductive structure 50S. The step region 55 is physically exposed.

Figure 18:
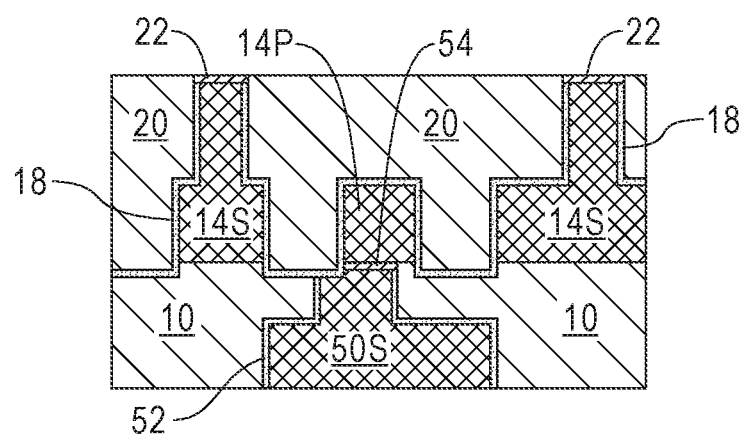
FIG. 18 is a cross sectional view of the exemplary structure of FIG. 17 after forming a non-conductive barrier liner on the at least one second electrically conductive structure, a second dielectric material layer, and an electrically conductive metal cap on a topmost surface of the via portion of the at least one second electrically conductive structure.

Referring now to FIG. 18, there is shown the exemplary structure of FIG. 17 after forming a non-conductive barrier liner 18 on the at least one second electrically conductive structure 14S, a second dielectric material layer 20, and an electrically conductive metal cap 22 on a topmost surface of the via portion of the at least one second electrically conductive structure 14S.

The non-conductive barrier liner 18 and the second dielectric material layer 20 that are employed in the second embodiment are identical to the non-conductive barrier liner 18 and the second dielectric material layer 20 employed in the first embodiment. Thus, the various materials, deposition process and thicknesses mentioned above for the non-conductive barrier liner 18 and the second dielectric material layer 20 are applicable here for the third embodiment of the present application. As is shown, the second dielectric material layer 20 has a topmost surface that is coplanar with topmost surfaces of the non-conductive barrier liner 18 and the topmost surface of the via portion 1 of each second electrically conductive structure 14S.

The electrically conductive metal cap 22 that is employed in the third embodiment is identical to the electrically conductive metal cap 22 employed in the first embodiment. Thus, the various materials, deposition process and thicknesses mentioned above for electrically conductive metal cap 22 are applicable here for the third embodiment of the present application.

Although not shown in the present application, another electrically conductive metal-containing layer can be formed atop the exemplary structure shown in FIG. 18 and processed as in the third embodiment to provide another interconnect level of an interconnect structure.

Referring to FIGS. 19A-22B, there are shown basic processing steps in accordance with a four embodiment of the present application. The fourth embodiment of the present application provides an interconnect structure that has enhanced reliability similar to that described above for the first embodiment. Notably, and in the fourth embodiment, the non-conductive barrier liner is replaced with a conventional diffusion barrier liner for better EM and capacitance performed. Further, and in the fourth embodiment, an electrically conductive metal cap 22, which is highly conductive, is formed on a topmost surface of a via portion 14V of an electrically conductive structure 14S. As mentioned above, the presence of the electrically conductive metal cap on the topmost surface of the via portion of the electrical conductive ensures short length EM benefits to the resultant interconnect structure. The fourth embodiment of the present application will now be described in greater detail.

Figure 19B:
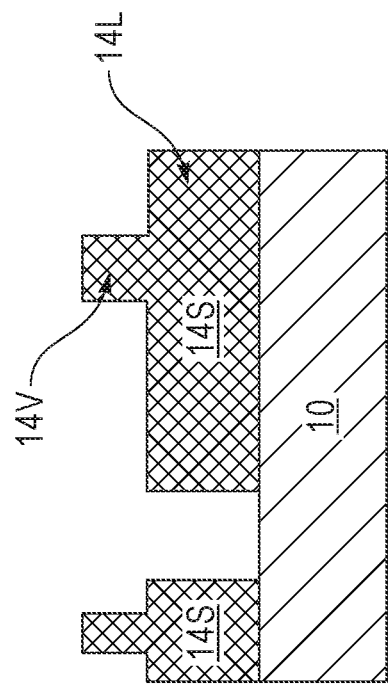
FIG. 19B is a cross sectional view of the exemplary structure of FIG. 19A through line X-X'.
Figure 19A:
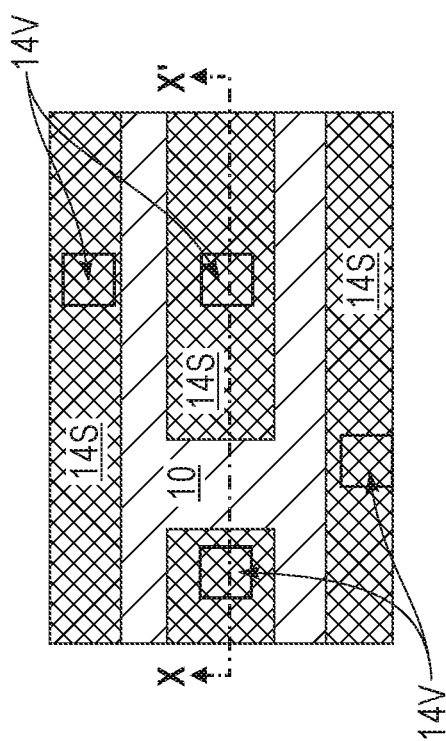
FIG. 19A is a top down view of an exemplary structure of a first dielectric material layer, and at least one electrically conductive structure containing a line portion and a via portion that can be employed in accordance with a fourth embodiment of the present application.

Referring now to FIGS. 19A-19B, there are shown through various an exemplary structure that can be employed in the fourth embodiment of the present application. Notably, FIGS. 19A-19B illustrate an exemplary structure that includes a first dielectric material layer 10, and at least one electrically conductive structure 14S containing a line portion 14L and a via portion 14V that can be employed in accordance with the fourth embodiment of the present application.

The exemplary structure shown in FIGS. 19A-19B can be formed utilizing the basic processing steps and materials mentioned above in FIGS. 1A-3C of the present application except that the first non-conductive barrier layer 18 is omitted in FIGS. 19A-19B. Although not shown, an optional first non-conductive barrier layer can be present between the first dielectric material layer 10 and the first electrically conductive structure 14S.

Figure 20B:
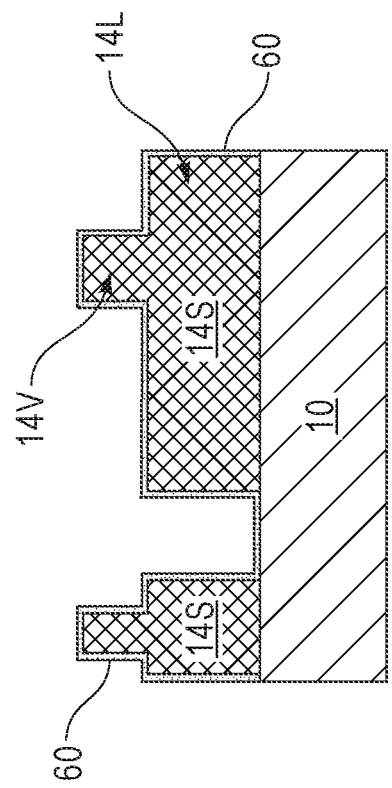
FIG. 20B is a cross sectional view of the exemplary structure of FIG. 20A through line X-X'.
Figure 20A:
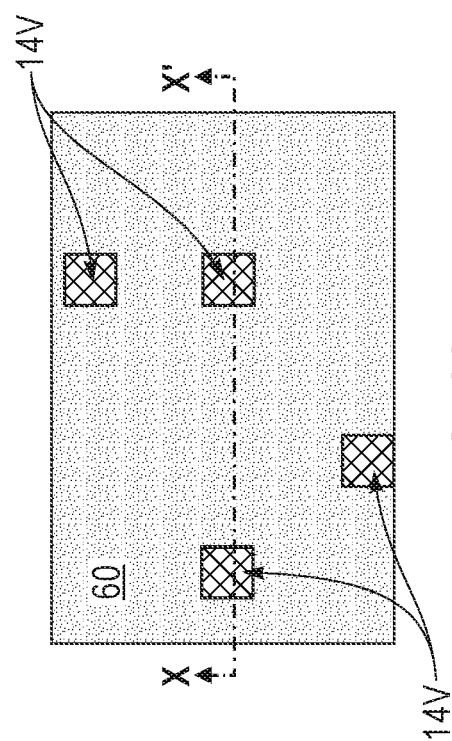
FIG. 20A is a top down view of the exemplary structure of FIG. 19A after forming a diffusion barrier layer on the at least one electrically conductive structure.

Referring now to FIGS. 20A-20B, there are shown through various views the exemplary structure of FIGS. 19A-19B after forming a diffusion barrier layer 60 on the at least one electrically conductive structure 14S. In this embodiment, the diffusion barrier layer 60 is composed of a conductive diffusion barrier material. Illustrate examples of conductive diffusion barrier materials that can be sued as the diffusion barrier layer 60 Ta, TaN, Ti, TiN, Ru, RuN, RuTa, RuTaN, W, or WN.

The diffusion barrier layer 60 can be formed utilizing a deposition process such as, for example, chemical vapor deposition (CVD), plasma enhanced chemical vapor deposition (PECVD), atomic layer deposition (ALD), or physical vapor deposition (PVD). In some embodiments, a conformal deposition process is employed. In other embodiments, a non-conformal deposition process is used. In either case, the diffusion barrier layer 60 typically has a thickness from 1 nm to 20 nm; other thicknesses for the diffusion barrier layer 60 are contemplated and can be employed in the present application as long as the selected thickness does not entirely fill in the gaps between each electrically conductive structure 14S that is provided by the line and via patterning processes.

Figure 21A:
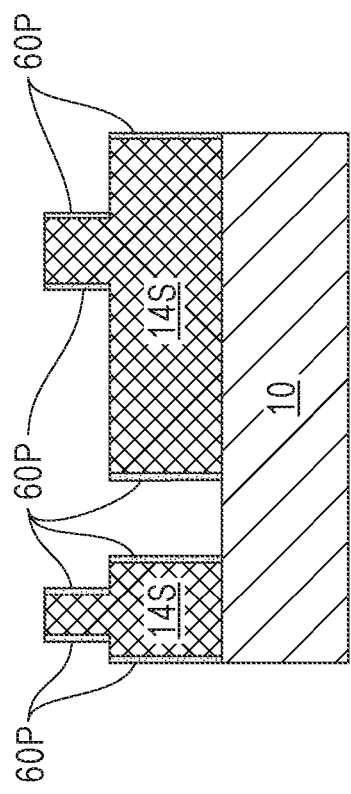
FIG. 21A is a top down view of the exemplary structure of FIG. 20A after performing a directional etch to remove the diffusion barrier layer from all horizontal surfaces of the at least one electrically conductive structure.
Figure 21B:
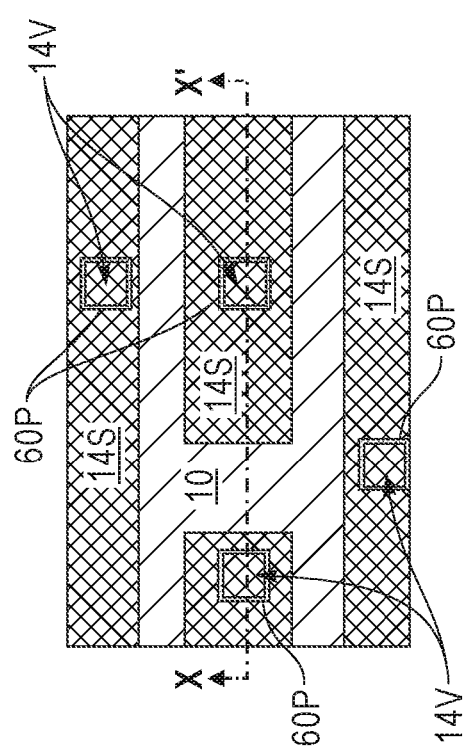
FIG. 21B is a cross sectional view of the exemplary structure of FIG. 21A through line X-X'.

Referring now to FIGS. 21A-21B, there are shown through various views the exemplary structure of FIGS. 20A-20B after performing a directional etch to remove the diffusion barrier layer 50 from all horizontal surfaces of the at least one electrically conductive structure 14S. The remaining diffusion barrier layer 50 may be referred to a diffusion barrier spacer 60P. The diffusion barrier spacers 60P are located on sidewalls of the via portion 14V and sidewalls of the line portion of each electrically conductive structure 14S.

Figure 22A:
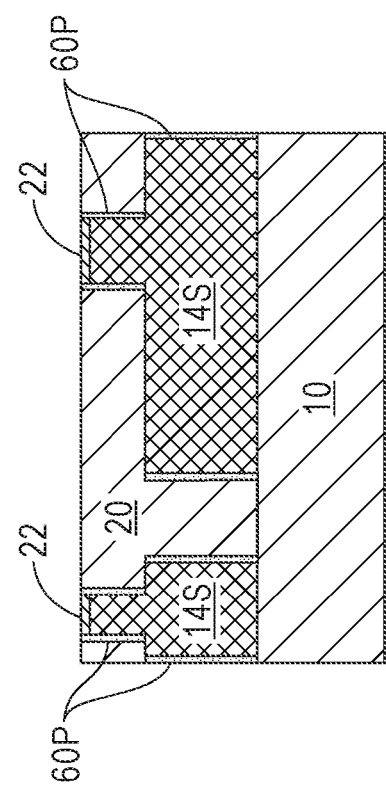
FIG. 22A is a top down view of the exemplary structure of FIG. 20A after forming a second dielectric material layer, and an electrically conductive metal cap on a topmost surface of the via portion of the at least one electrically conductive structure.
Figure 22B:
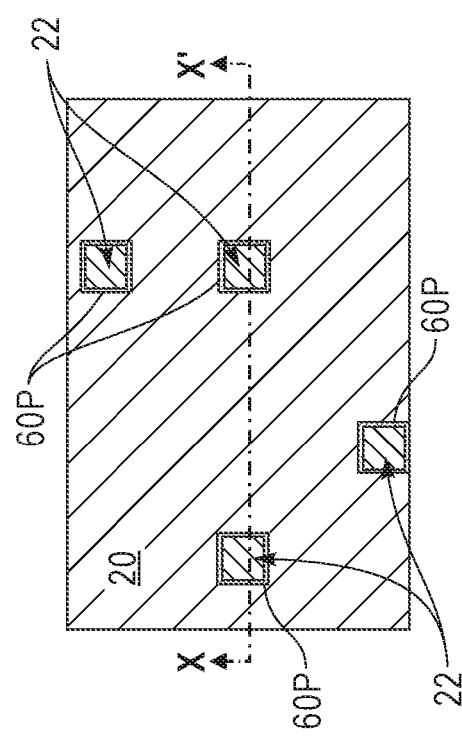
FIG. 22B is a cross sectional view of the exemplary structure of FIG. 22A through line X-X'.

Referring now to FIGS. 22A-22B, there are shown through various views the exemplary structure of FIGS. 21A-21B after forming a second dielectric material layer 20, and an electrically conductive metal cap 22 on a topmost surface of the via portion 14V of the at least one electrically conductive structure 14S.

The second dielectric material layer 20 and the electrically conductive metal cap 22 that are employed in the fourth embodiment are identical to the second dielectric material layer 20 and the electrically conductive metal cap 22 employed in the first embodiment. Thus, the various materials, deposition process and thicknesses mentioned above for the second dielectric material layer 20 and electrically conductive metal cap 22 are applicable here for the fourth embodiment of the present application.

Although not shown in the present application, another electrically conductive metal-containing layer can be formed atop the exemplary structure shown in FIGS. 22A-22B and processed as in the third embodiment to provide another interconnect level of an interconnect structure.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. An interconnect structure comprising:
at least one electrically conductive structure located on a first dielectric material layer, wherein the at least one electrically conductive structure comprises a via portion located on a line portion;
a non-conductive barrier liner located on an entirety of each sidewall of the line portion and a portion of a topmost surface of the line portion and sidewalls of the via portion of the at least one electrically conductive structure, wherein the non-conductive barrier liner has a bottommost surface that is coplanar with a bottommost surface of the line portion;
a second dielectric material layer embedding the at least one electrically conductive structure and the non-conductive barrier liner; and
an electrically conductive metal cap having a bottommost surface, wherein an entirety of the bottommost surface is located on a topmost surface of the via portion of the at least one electrically conductive structure.

2. The interconnect structure of claim 1, further comprising an electrically conductive structure embedded in the first dielectric material layer, wherein the electrically conductive structure embedded in the first dielectric material layer is misaligned to the at least one electrically conductive structure embedded in the second dielectric material layer and has a via portion and a line portion, wherein the via portion includes a step region located on one side thereof.

3. The interconnect structure of claim 1, further comprising a non-conductive barrier material layer located between the at least one electrically conductive structure and the first dielectric material layer.

4. The interconnect structure of claim 1, further comprising a non-conductive barrier material layer located on physically exposed portions of the topmost surface of the second dielectric material layer.

5. The interconnect structure of claim 1, wherein the non-conductive barrier liner comprises aluminum nitride, aluminum oxynitride, or a material that includes atoms of at least Si, C and N.

6. The interconnect structure of claim 1, wherein the electrically conductive metal cap comprises Co, Ta, TaN, Ru, or W.

* * * * *